United States Patent [19]

Engel et al.

[11] Patent Number: 4,514,752
[45] Date of Patent: Apr. 30, 1985

[54] DISPLACEMENT COMPENSATING MODULE

[75] Inventors: Peter A. Engel, Binghamton; Douglas H. Strope, Apalachin; Thomas E. Wray, Vestal, all of N.Y.

[73] Assignee: International Business Machines Corporation, Armonk, N.Y.

[21] Appl. No.: 598,631

[22] Filed: Apr. 10, 1984

[51] Int. Cl.³ .............................................. H01L 23/10
[52] U.S. Cl. ...................................... 357/72; 29/588; 29/589; 264/264; 264/272.17; 357/74
[58] Field of Search ................. 29/588, 589, 590, 591, 29/627; 357/72, 74; 264/272.17, 264

[56] References Cited

U.S. PATENT DOCUMENTS

| | | | |
|---|---|---|---|
| 4,233,620 | 11/1980 | Darrow et al. | 357/74 |
| 4,312,116 | 1/1982 | Moser et al. | 29/588 |
| 4,374,080 | 2/1983 | Schroeder | 264/102 |

OTHER PUBLICATIONS

Adhesion and Adhesives; R. Houwink & G. Salomon, editors, Elsevier Publ. Co., New York, 1967; vol. 2, applications.
Technology of Adhesives; John Delmonte Reinhold Publishing Corp., New York, 1947.

*Primary Examiner*—G. Ozaki
*Attorney, Agent, or Firm*—John H. Bouchard

[57] ABSTRACT

A displacement compensating module is disclosed wherein a blocking article, such as a polyimide tape, is disposed between an epoxy composition and the back surface of a substrate and between the epoxy composition and the inner surface of a cap for blocking the movement of the epoxy composition into a gap area during the manufacture of the module. An electronic module comprises a substrate, an integrated circuit chip disposed on the substrate, a cap disposed over and enclosing the chip and the substrate, a heat dissipator disposed between the cap and the chip for carrying away the heat dissipated by the chip, and an epoxy composition secured to the back surface of the substrate for sealing the module, and specifically, the chip within the module from harmful external influences. The boundary of a gap is defined by the edge of the substrate and the inner surface of the cap. A blocking article, such as a polyimide tape, is disposed between the epoxy composition on one side and the back side of the substrate coupled with the inner surface of the cap on the other side for holding the epoxy composition external to the gap and preventing the epoxy composition from being disposed within the gap during the manufacture of the module. As a result, the cap is relatively free to move with respect to the substrate. Unnecessary distortion of the cap is minimized and resultant damage to the chips within the cap is avoided.

6 Claims, 6 Drawing Figures

DISPLACEMENT COMPENSATING MODULE

BACKGROUND OF THE INVENTION

1. Field of the Invention

The present invention pertains to electronic packaging technology, and more particularly, to the packaging of modules comprising silicon chips mounted on a substrate disposed under a cap.

2. Description of the Prior Art

Electronic packaging technology generally includes the packaging of silicon chips within a module, the module including a substrate, the silicon chips mounted on the substrate, and a cap disposed over and enclosing the substrate inclusive of the chips. One such electronics packaging technique is disclosed in U.S. Pat. No. 4,312,116 to Moser et al assigned to the same assignee as that of the present invention.

The specification of U.S. Pat. No. 4,312,116 is incorporated by reference into the specification of this application.

In the Moser et al patent, silicon chips are mounted on a substrate, and a cap is disposed over the substrate, enclosing the substrate inclusive of the chips. However, subsequent to the development of the invention disclosed in the Moser et al patent, the density of the circuits on the chips has increased as a result of a demand for increased performance in modern day computing systems. Since a certain amount of power is dissipated within a chip, the increased circuit density on the chips has resulted in an increase in the heat dissipated by the chips. In order to prevent damage to the chips due to excessive heat dissipation, a heat dissipating means, such as a thermal grease, is disposed in the space between the chips and the top of the cap. The thermal grease carries away the heat dissipated by the chip.

As taught by the Moser et al patent, a gap exists between the edge of the substrate and the inner surface of the cap. An epoxy sealant is disposed over the back side of the substrate and is allowed to flow over the entire back side of the substrate and into the gap between the edge of the substrate and the inner surface of the cap. The epoxy within the gap adheres to the edge of the substrate and to the inner surface of the cap. As a result, the epoxy seals the module thereby protecting the chips disposed within the module from harmful external influences.

However, when the module is exposed to variations in external temperature, both the cap and the substrate tend to expand and contract, but at different rates. The epoxy within the gap prevents the cap from expanding and contracting independent of the substrate. As a result, the cap distorts. Since the cap is in contact with the chip via the heat dissipating means (the thermal grease), the distortion of the cap places an unacceptable degree of pressure or stress on the silicon chips mounted on the substrate. The chips are connected to conductor strips or lands on the substrate via a plurality of solder balls. The pressure placed on the chips tends to produce cracks within the solder balls. As a result of these cracks, an open circuit may be produced between the silicon chip in question and the conductor strip to which it is connected.

SUMMARY OF THE INVENTION

It is a primary object of the present invention to improve the electronics packaging technique of the prior art by allowing the module cap to freely expand and contract substantially independent of the module substrate in response to variations in external temperature.

It is another object of the present invention to improve the electronics packaging technique of the prior art by adhesively securing a blocking means, such as a length of tape, to a perimeter of the back side of the substrate and to a perimeter of the inner surface of the cap thereby blocking an entrance to the gap between the edge of the substrate and the inner surface of the cap, the blocking means being adhesively secured prior to the application of an epoxy sealant to the back side of the substrate.

These and other objects of the present invention are achieved by adhesively securing a blocking means, such as a polyimide tape, to part of the back side of the substrate and to part of the inner surface of the cap prior to disposing and adhesively securing the epoxy sealant to the back side of the substrate. As a result, the blocking means prevents the epoxy sealant from entering the gap disposed between the edge of the substrate and the inner surface of the cap. The sealant is adhesively secured to the back side of the substrate, to the tape, and to a portion of the inner surface of the cap. A bond point between the substrate and the cap is moved away from the gap. Since the sealant does not enter the gap between the cap and the substrate and the bond point is moved away from the gap, a less rigid connection is created between the cap and the substrate. Therefore, when the cap expands or contracts in response to changes in temperature, bending of the cap is greatly reduced. As a result, the degree of distortion of the cap, caused by expansion and contraction of the cap in response to changes in temperature, is minimized. Consequently, the solder balls, which connect the silicon chip to the conductor strips on the module substrate, receive less stress. The tendency for the creation of an open circuit, between the chip and the conductor strips, is avoided.

Further scope of applicability of the present invention will become apparent from the detailed description presented hereinafter. It should be understood, however, that the detailed description and the specific examples, while representing a preferred embodiment of the invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from a reading of the detailed description given hereinbelow and the accompanying drawing, which are given by way of illustration only, and thus are not limitative of the present invention, and wherein.

DETAILED DESCRIPTION OF THE PREFERRED EMBODIMENT

Figure 1:
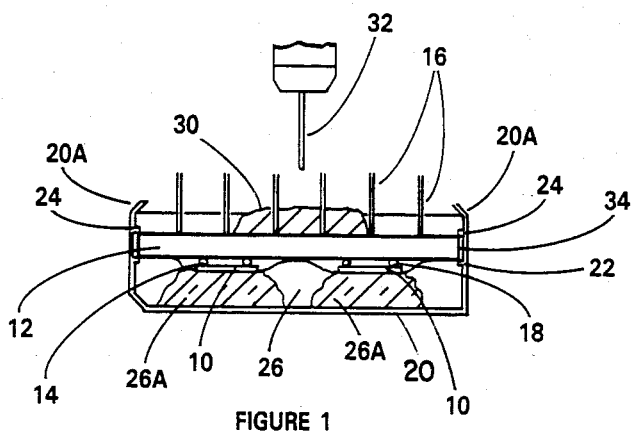
FIGS. 1 through 3 represent a prior art electronics packaging technique associated with the mounting of a silicon chip to a substrate, the disposition of a cap over the substrate inclusive of the chip, and the disposition of an epoxy sealant composition over the back side of the substrate and within the gap between the substrate edge and the inner surface of the cap.
Figure 2:
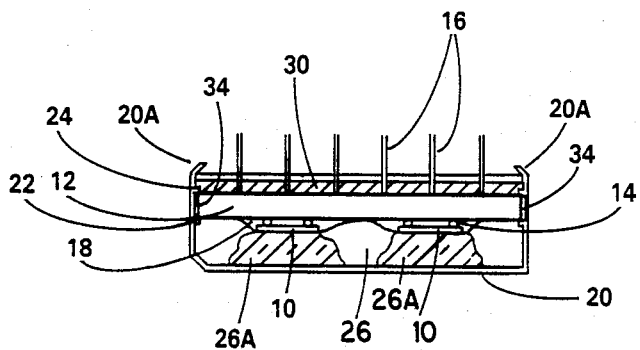
Figure 3:
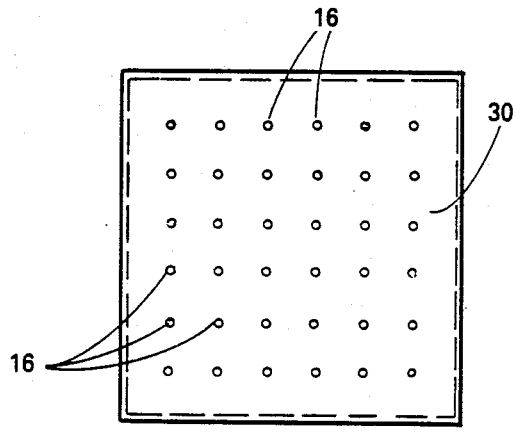

Referring to FIGS. 1 through 3, an electronic module of the prior art is illustrated. The electronic module shown in FIGS. 1 through 3 is illustrated in U.S. Pat. No. 4,312,116, to Moser et al, the disclosure of which is incorporated by reference into the specification of this application.

In FIG. 1, a silicon chip 10 is mounted to a substrate 12 via a plurality of solder balls 14. A plurality of pins 16 are connected to the silicon chips 10 via a plurality of conductor strips disposed on the surface of the substrate 12 and the solder balls 14. A coating 18 of silicone polymer is applied over the chips 10 to seal the chips on the substrate. One good silicone polymer is a produce sold by Dow Corning under the trademark "sylgard". The silicone polymer is cured according to conventional techniques before the module and cap are assembled.

A cap 20 is disposed over and encloses the substrate 12 inclusive of the chips 10. The substrate 12 is first rested on indentations 22. In the prior art, kerfs 24 were formed such that the substrate 12 is held in its proper position in preparation for the application of an epoxy sealant material to the back side of the substrate. The chips 10 are disposed inwardly within space 26 inside the cap 20.

In the Moser et al patent, space 26 was not filled with any specific material, such as a heat dissipating material. However, as the density of the circuits on the chips 10 increased, the heat dissipated by the chips 10 also increased. Consequently, the need for a heat dissipating material in space 26 became evident. As a result, in FIGS. 1 and 2, the space 26 includes a heat dissipating means 26a disposed therein, the heat dissipating means being in contact with the chips 10 and the cap 20. One such heat dissipating means may be a thermal grease 26a. The thermal grease 26a conducts the heat away from the chips 10 during their operation. One such thermal grease 26a is a zinc oxide (ZnO) emulsion in silicone oil.

As shown in FIG. 1, an epoxy sealant composition 30 is applied to the back side of the substrate 12 from a dispensing needle 32. A preferred epoxy is one sold by 3M Company under the trade designation Scotchcast 5239 and has a mix ratio of about 46% resin by weight, 52% hardener by weight, and about 2% dye by weight. This is a preferred epoxy; however, other epoxys as well as other mix ratios will suffice. The cap 20 is indented inwardly along its peripheral edge 20a for the purpose of holding the substrate 12 and the epoxy 30 firmly in place.

As shown in FIGS. 1 and 2, the epoxy 30 is allowed to flow into a gap 34 disposed between the edge of the substrate 12 and the inner surface of the cap 20. The epoxy within the gap 34 seals the edge of the substrate 12 to the inner surface of the cap 20. However, when the cap 20 is subjected to variations in external temperature, it expands and contracts. Since the epoxy 30 seals the edge of the substrate 12 to the inner surface of the cap 20 in gap 34, a contraction of the cap 20 results in a bending of the top surface of the cap. This bending of the top surface of the cap causes the thermal grease 26a to place a severe amount of stress on the chips 10. As a result, cracks tend to develop in the solder balls 14. These cracks result in an open circuit connection between the chip 10 and the conductor strip or land on which the solder balls 14 are disposed.

Figure 4:
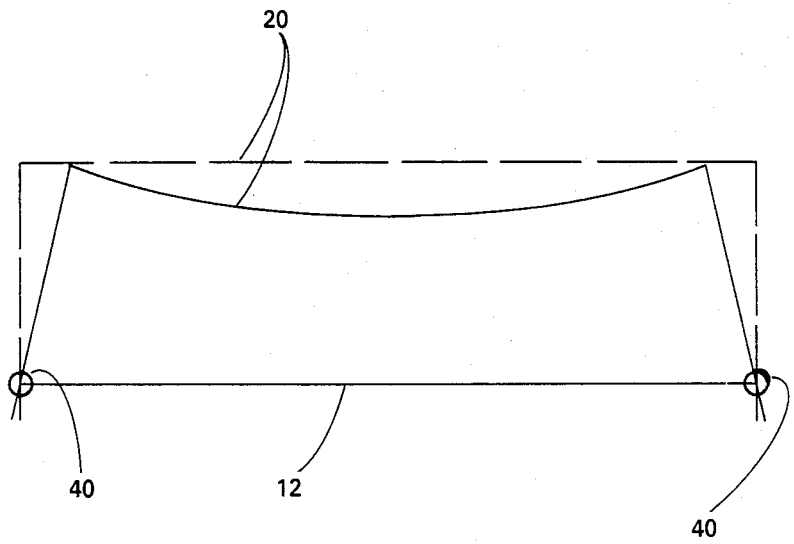
FIG. 4 illustrates the expansion and contraction of a cap on the module of FIGS. 1 through 3, the expansion and contraction resulting in the formation of cracks in the solder balls which connect the silicon chip to the conductor strips disposed on the surface of the substrate.

Referring to FIG. 4, a side view of cap 20 in association with the substrate 12 is illustrated, the side view depicting the expansion and contraction of cap 20 relative the substrate 12. In FIG. 4, note that the edge of the substrate 12 is bonded to the inner surface of cap 20 at points 40. Each of the points 40 represent the epoxy 30 within gap 34 of FIGS. 1 and 2 wherein the epoxy seals and bonds the edge of the substrate 12 to the inner surface of the cap 20. The bond between the substrate 12 and the cap 20 is made at a high temperature, near the glass transition temperature of the epoxy 30. When the cap 20 is not experiencing an increase or decrease in temperature, it maintains its normal appearance, as shown by the dotted line in FIG. 4. However, as a result of the bond appearing at each of the points 40, when the cap experiences an increase in temperature, it expands. When the cap experiences a decrease in temperature, it contracts as shown by the solid line in FIG. 4. The contraction of the cap 20 in FIG. 4 places a certain amount of compressive stress on the chips 10 via the thermal grease 26a. This stress produces the cracks in the solder balls 14 mentioned above, the cracks resulting in the open circuit connections between the chips 10 and the conductor lands on which the solder balls 14 are disposed.

Figure 5:
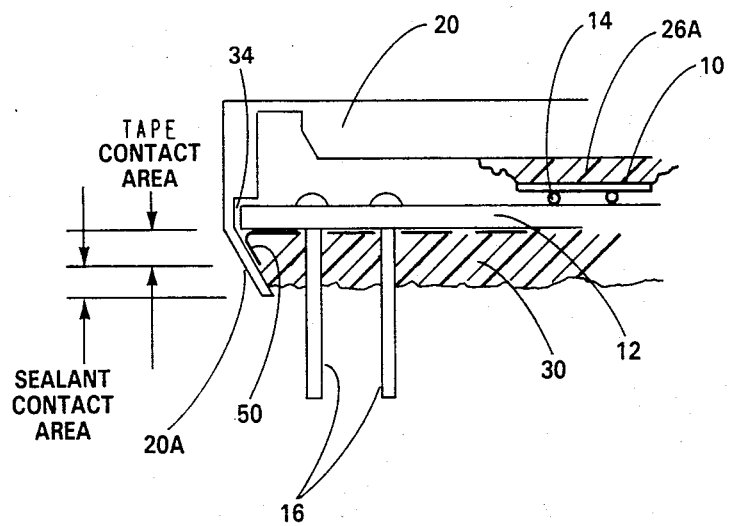
FIG. 5 illustrates a blocking means, such as a polyimide tape, according to the present invention for preventing the epoxy sealant composition from entering the gap area disposed between the edge of the module substrate and the inner surface of the cap.

Referring to FIG. 5, a side view of a module, in cross section, is illustrated, the module including the blocking means according to the present invention for preventing and blocking the epoxy sealant 30 from entering the gap area 34 and permitting the cap 20 to move relatively freely with respect to the substrate 12. In FIG. 5, a blocking means 50 is illustrated, the blocking means 50 being disposed along the perimeter of the substrate 12 and along the perimeter of the inner surface of the cap 20 and being further disposed between the epoxy composition 30 and the substrate 12 and between the epoxy composition 30 and the inner surface 20a of the cap 20. The blocking means 50 blocks the entrance to the gap 34 and prevents the epoxy 30 from entering the gap 34 to be sealed therein. In the preferred embodiment of the present invention, the blocking means is a polyimide tape 50 and is adhesively secured to the following surfaces prior to the disposition of the epoxy composition 30 to the back side of the substrate 12: to the inner surface area 20a of the cap 20 and to the back side of the substrate 12. The tape 50 is adhesively secured to these surfaces around the entire perimeter of module. When the module is heated and cooled, the cap 20 expands and contracts in the manner illustrated by the dotted line in FIG. 6 of the drawings.

The functional operation of the present invention will be described in the following paragraphs with reference to FIG. 6 of the drawings.

Figure 6:
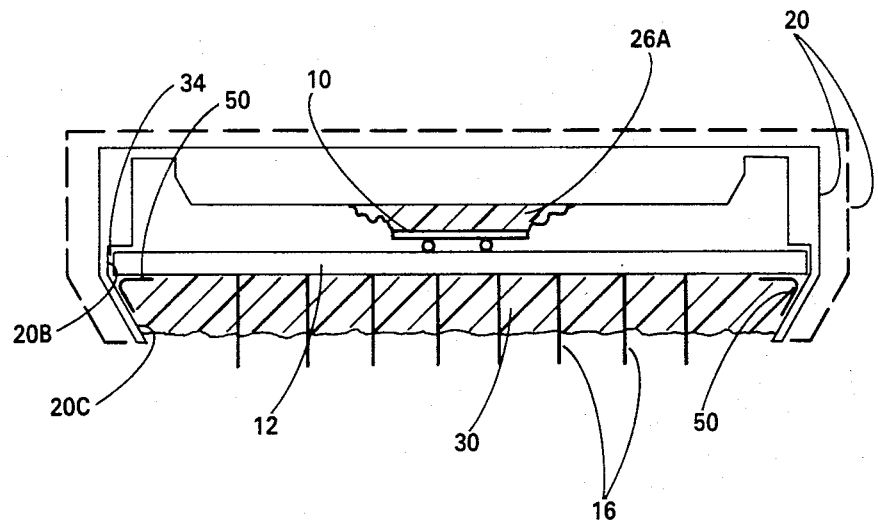
FIG. 6 illustrates the expansion and contraction of a cap on a module as a result of the utilization of the blocking means of present invention.

Referring to FIG. 6, the expansion and the contraction of a cap on a module, as a result of the utilization of the blocking means according to the present invention, is illustrated. In FIG. 6, the edge of the substrate 12 is not sealed via the epoxy 30 to the inner surface area 20b of cap 20. However, the bottom of the substrate 12 is sealed to the inner surface area 20c of the cap 20 via the epoxy sealant 30. Therefore, when the cap 20 contracts, due to a reduction in external temperature, the cap 20 is relatively free to translate or move without bending. The dotted outline of cap 20, in FIG. 6, illustrates the size and relative shape of cap 20 after an expansion of the cap 20 takes place. The solid outline of cap 20 illustrates the size and relative shape of cap 20 after a contraction of the cap 20 takes place. As illustrated in FIG. 6, the cap 20 is relatively free to move with respect to the substrate 12. This freedom of movement of cap 20 is possible as a result of the available space provided by gap area 34 due to the removal of the epoxy 30 therefrom. The distortion of the cap is minimized. Consequently, the unacceptable degree of stress placed on the chips 10 via the thermal grease 26a is avoided and the tendency for an open circuit connection between the chips 10 and the conductor strips disposed on the surface of the substrate 12 is avoided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An electronic module, comprising:
    a substrate including a back surface and an edge;
    a cap disposed over the top surface of said substrate, the cap having an inner surface, the boundaries of a gap being
    defined by the edge of said substrate and said inner surface of said cap;
    a sealant disposed over the back surface of said substrate; and
    holding means disposed between said sealant on one side and the back surface of said substrate coupled with the inner surface of said cap on the other side for holding said sealant external to said gap and preventing said sealant from being disposed therein.

2. The electronic module of claim 1 wherein the holding means comprises a polyimide tape adhesively secured to the back surface of said substrate and to the inner surface of said cap.

3. The electronic module of claim 1, wherein:
    a first portion of said sealant completely covers said holding means,
    a second portion of said sealant is adhesively secured to said first portion of said sealant and to the inner surface of said cap.

4. A method of manufacturing an electronic module, said module including a substrate, comprising the steps of:
    covering and enclosing said substrate with a cap, a gap traversing the perimeter of said substrate being defined by the edge of said substrate and the inner surface of said cap;
    securing a blocking means to the back side of said substrate and to the inner surface of said cap so as to cover said gap; and
    applying a sealant composition to the back side of said substrate until the sealant composition at least partially covers said blocking means.

5. The method of manufacturing an electronic module according to claim 4, wherein the step of securing a blocking means to the back side of said substrate further comprises the step of:
    adhesively securing a piece of tape to the back side of said substrate and to the inner surface of said cap so as to cover said gap.

6. The method of manufacturing an electronic module according to claim 4, wherein the step of applying a sealant composition comprises the steps of:
    applying a first portion of said sealant composition to the back side of said substrate until the sealant composition completely covers said blocking means; and
    applying a second portion of said sealant composition over said first portion until a predetermined amount of said second portion is adhesively secured to the inner surface of said cap.

* * * * *